(12) United States Patent
Ryan et al.

(10) Patent No.: US 12,393,245 B2
(45) Date of Patent: Aug. 19, 2025

(54) OVER-ENERGY PROTECTION FOR A POWER SUPPLY

(71) Applicant: Advanced Energy Industries, Inc., Denver, CO (US)

(72) Inventors: Robert Ryan, Cork (IE); Mark Corpuz, Cork (IE); Andrejs Gasilovs, Midleton (IE); Jack William Bermingham, Kinsale (IE)

(73) Assignee: Advanced Energy Industries, Inc., Denver, CO (US)

( * ) Notice: Subject to any disclaimer, the term of this patent is extended or adjusted under 35 U.S.C. 154(b) by 271 days.

(21) Appl. No.: 18/326,063

(22) Filed: May 31, 2023

(65) Prior Publication Data

US 2024/0402781 A1    Dec. 5, 2024

(51) Int. Cl.
*G06F 1/28*    (2006.01)
*G06F 1/30*    (2006.01)
*G01R 15/14*   (2006.01)

(52) U.S. Cl.
CPC .............. *G06F 1/28* (2013.01); *G06F 1/305* (2013.01); *G01R 15/146* (2013.01)

(58) Field of Classification Search
CPC .......... G06F 1/28; G06F 1/305; G01R 15/146
See application file for complete search history.

(56) References Cited

U.S. PATENT DOCUMENTS

| | | | |
|---|---|---|---|
| 4,945,910 A | 8/1990 | Budyko et al. | |
| 9,577,536 B2 | 2/2017 | Yang | |
| 11,588,321 B2 | 2/2023 | Askan | |
| 2004/0030328 A1 | 2/2004 | Eggers et al. | |
| 2004/0095100 A1* | 5/2004 | Thompson ......... | A61B 18/1206 322/32 |
| 2015/0105768 A1 | 4/2015 | Gilbert et al. | |
| 2018/0324910 A1* | 11/2018 | Picard .................... | H05B 45/37 |
| 2021/0177503 A1 | 6/2021 | Altmann et al. | |
| 2022/0278674 A1 | 9/2022 | Cadossi et al. | |

OTHER PUBLICATIONS

PCT, International Search Report and Written Opinion issued in PCT/US2024/030640, Aug. 27, 2024, 14 pages.

* cited by examiner

*Primary Examiner* — Adolf D Berhane
*Assistant Examiner* — Afework S Demisse
(74) *Attorney, Agent, or Firm* — NOD Law PC

(57) ABSTRACT

An energy delivery system comprises a power supply configured to generate a pulsed output voltage and a pulsed output current, and an over-energy protection (OEP) circuit coupled to the power supply. The OEP circuit senses the output current of the power supply and generates a sensed current signal, generates a charge-delivered signal from the sensed current signal that is representative of the charge delivered by the power supply over a time interval, and generates a fault signal that disables the power supply if the charge-delivered signal exceeds a threshold.

18 Claims, 14 Drawing Sheets

OVER-ENERGY PROTECTION FOR A POWER SUPPLY

FIELD OF THE DISCLOSURE

This disclosure relates generally to power supplies. More particularly, this disclosure relates to an over-energy protection (OEP) to limit the amount of energy that can be delivered by a power supply.

BACKGROUND

A pulsed electric field (PEF) generator is a type of power supply that is configured to generate suitable output waveshapes for a wide array of applications. Generally, the PEF generator produces short, intense bursts of electric field pulses that are used to apply a high-voltage electric field to various substances or materials for a brief period. PEF generators have many possible applications. They may be used in the food industry to inactivate bacteria, yeasts, and molds in food products, thus extending their shelf life. They may be used in water and wastewater treatment to break down pollutants. They may be used in biotechnology to help transfer genes into cells. These are but a few of many possible applications of PEF generators.

Another example of the possible uses of a PEF generator is in medical applications. In one such application, a PEF generator is deployed in a medical device known as an electroporator for use in cancer treatments. The PEF generator of the electroporator generates pulsed output waveforms with amplitudes ranging from 20V to 3 kV depending on the treatment. The pulsed voltage waveforms generated by the electroporator are applied to cancer tumors to induce the biological phenomenon of electroporation and ultimately induce tumor death. PEF generators of this nature can be rated for extremely high peak power levels as high as 150 kW.

PEF generators often use a high internal energy storage capacitor bank that is applied through a switch network to create a clean pulsed square wave output. The capacitor bank stores substantially more energy than is delivered, which is necessary to produce well shaped square wave output voltages. Where the PEF generator is used in a medical application, such as an electroporator, ensuring patient safety is of the utmost importance. However, given the high available output powers and high internal energy storage of PEF generators, the use of such generators has an inherent risk that the switch network could switch incorrectly or be controlled incorrectly, which could potentially cause the entire stored energy of the capacitor bank to be output from the PEF generator and applied directly to the patient, thereby delivering excessive energy that could cause harm such as thermal damage to the patient's tissue. Other applications of PEF generators beyond medical applications may also create a risk of damage or harm by inadvertent output of excessive energy.

SUMMARY

This disclosure provides a rapid acting over-energy protection (OEP) circuit for a power supply that limits the energy that can be delivered by the power supply.

One aspect of this disclosure is an energy delivery system comprising a power supply configured to generate a pulsed output voltage and a pulsed output current, and an over-energy protection (OEP) circuit coupled to the power supply. The OEP circuit is configured to sense the output current of the power supply and generate a sensed current signal, to generate a charge-delivered signal from the sensed current signal that is representative of the total charge delivered by the power supply over a time interval, and to generate a fault signal that disables the power supply if the charge-delivered signal exceeds a reference voltage.

In one implementation, the OEP circuit comprises a current sensor configured to sense the output current of the power supply and to generate the sensed current signal; an integrator configured to integrate the sensed current signal to generate the charge-delivered signal; and a comparator configured to compare the charge delivered with the threshold, and to generate the fault signal to disable the power supply if the charge-delivered signal exceeds the reference voltage.

In another implementation, the current sensor comprises a shunt resistor and a rectifier, the shunt resistor being configured to produce a voltage drop proportional to the output current, and the rectifier being configured to produce the sensed current signal based on the voltage drop.

In a further implementation, the integrator is a non-inverting integrator. The non-inverting integrator comprises an operational amplifier having a non-inverting terminal and an inverting terminal, the non-inverting terminal being coupled to the sensed current signal, and the charge-delivered signal being produced at the output of the operational amplifier; and an integrating capacitor and a reset resistor coupled in parallel between the output of the operational amplifier and the inverting terminal of the operational amplifier, the reset resistor providing a path for the integrating capacitor to discharge after the time interval.

In a further implementation, the pulsed output voltage of the power supply comprises a constant voltage burst train, the burst train comprising a series of bursts, wherein each burst comprises a series of pulses. In this implementation, the time interval is a duration of a burst of the burst train generated by the power supply.

In a further implementation, the reset resistor is set to a value to cause the integrating capacitor to fully discharge during a time interval between bursts of the burst train.

In a further implementation, the OEP circuit is formed as an integral part of the power supply.

In a further implementation, the power supply comprises an energy storage capacitor bank and a pulse generator coupled by a series switch, the series switch being open when the generator is not generating the pulsed output voltage and the series switch being closed when the generator is generating the pulsed output voltage.

In a further implementation, a transistor is coupled to the non-inverting input of the operational amplifier of the integrator and is configured to disable the OEP circuit, based on a status of the series switch coupled to the energy storage bank of the power supply.

Another aspect of this disclosure is an over-energy protection (OEP) circuit for a power supply. The OEP circuit comprises a current sensor configured to sense an output current of the power supply and to generate a sensed current signal representative of the output current; an integrator coupled to the current sensor and configured to integrate the sensed current signal to produce a charge-delivered signal representative of the total energy delivered by the power supply over a time interval; and a comparator coupled to the integrator and configured to compare the charge-delivered signal with a threshold and to generate a fault signal that disables the power supply when the charge-delivered signal exceeds the threshold.

A further aspect of this disclosure is a method for limiting the energy delivered by a power supply. The method comprises sensing an output current of the power supply; determining a total charge delivered by the power supply during a time interval from the sensed output current; comparing the total charge delivered by the power supply during the time interval with a threshold; and disabling operation of the power supply if the total charge delivered by the power supply during the time interval exceeds the threshold.

These and other aspects of this disclosure are depicted in the accompanying drawings and description and will be apparent based thereon.

DETAILED DESCRIPTION

A pulsed electric field (PEF) generator is one type of power supply that produces short, intense bursts of electric field pulses that are used to apply a high-voltage electric field to various substances or materials for a brief period. PEF generators find application in many fields, including without limitation the food industry, water and wastewater treatment, biotechnology, and medicine. For purposes of explaining the PEF generator and over-energy protection (OEP) circuit of this disclosure in the context of one possible application, the following description is with reference to a PEF generator as used in a medical device known as an electroporator for treatment of cancer. It should be understood, however, that this disclosure is not so limited, and that the PEF generator and OEP circuit described herein may be advantageously deployed in many other applications.

PEF therapy may be used in cancer treatments to induce the biological phenomenon of reversible (RE) or irreversible (IRE) electroporation. Electroporation is a biological phenomenon in which high intensity, short duration electric field (E-field) pulses are applied to cells. E-field pulses with magnitudes of less than about 1 kV/cm induce the formation of small pores in the cell membrane. The cell membrane acts as a protective barrier to keep toxic substances outside the cell, which can be a disadvantage in medical treatment in that the cell membrane acts as an impermeable barrier to many drugs. With application of RE electroporation, pores form in the cell membrane to cause the membrane to become permeable to many drugs that otherwise could not cross the barrier.

In the medical field, PEF generators are of particular use in cancer therapy where RE electroporation can be applied to tumors in combination with previously impermeable anti-cancer drugs, to enable the drugs to cross the cell membrane and induce cell and tumor death. When E-fields higher than about 1 kV/cm are applied to cells, IRE electroporation can be induced. In this case the applied E-fields are strong enough to damage the cell membrane beyond repair, thus inducing cell death without application of any drugs. Thus, IRE electroporation may be used in medical treatments that require ablation of human tissue. A common example is the use of PEF in pulsed-field ablation (PFA) therapy for cardiac arrhythmia or in treating skin lesions.

Figure 1:
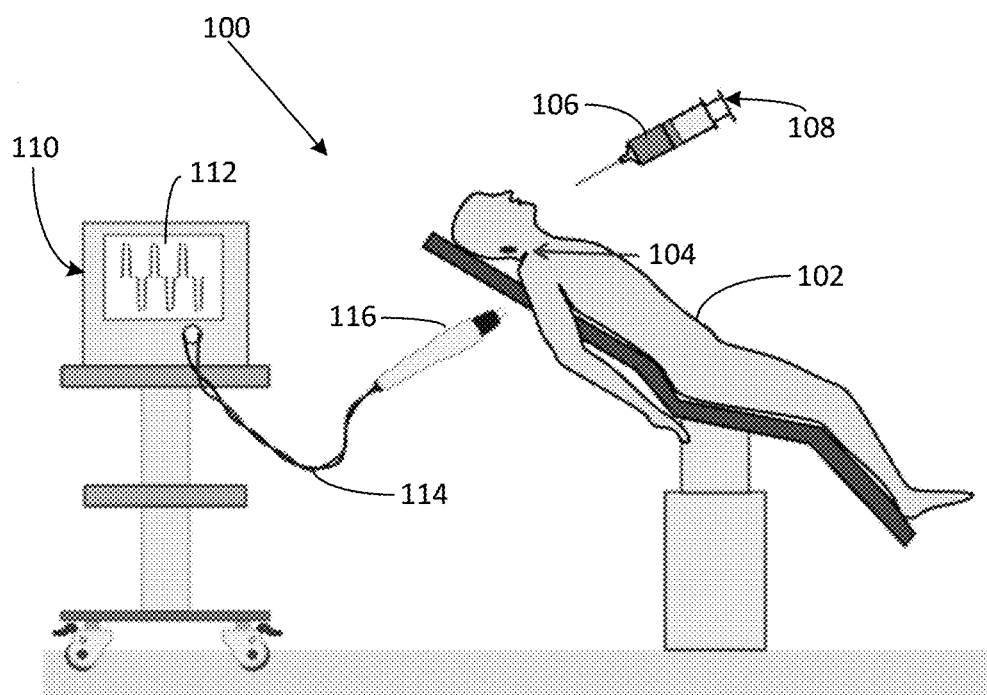
FIG. 1 is a conceptual diagram of an exemplary patient setting for electrochemotherapy (ECT) treatment, in accordance with this disclosure.

The use of a PEF generator to effect electroporation of cancer cells in combination with application of anti-cancer drugs to the cancer cells is sometimes referred to as electrochemotherapy (ECT). ECT is useful for treating skin tumors that are unsuitable for treatment by other methods such as resection. A typical patient setting 100 for ECT treatment is shown in FIG. 1 for a patient 102 with a skin tumor 104. A clinician delivers an anti-cancer drug 106 via an injection from syringe 108 into tumor 104, or in some cases intravenously. Electroporator 110 is then used to generate high intensity, short duration E-field pulses. PEF generator 112 is a subcomponent of electroporator 110 that produces the E-field pulses. Electroporator 110 may also include a user interface (UI) such as a touch screen and a foot pedal or other mechanism for controlling pulse delivery. Pulses are delivered from PEF generator 112 to patient 102 via cable 114 and probe 116. Probe 116 acts as a mechanical interface between PEF generator 112 and patient 102 and may be, for example, a hand-held probe in a plastic housing. Steel needles are configured on the tip of probe 116 to penetrate tumor 104. The pulsed output from PEF generator 112 is applied across these needles to induce an E-field within tumor 104 for RE electroporation.

Figure 2:
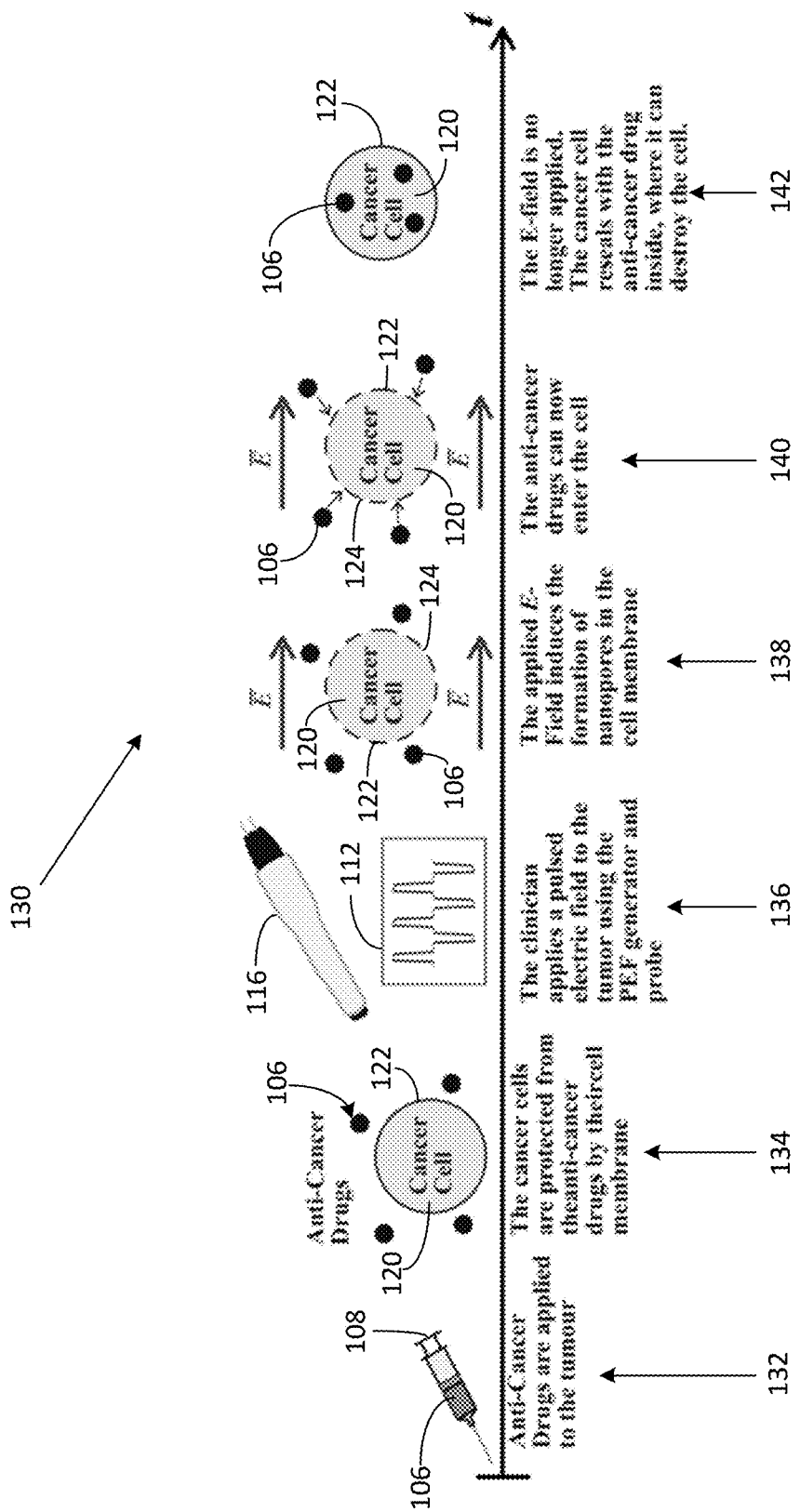
FIG. 2 is a conceptual diagram of an exemplary treatment timeline for skin ECT, in accordance with this disclosure.

FIG. 2 is a conceptual diagram of an exemplary treatment timeline 130 for skin ECT using a PEF generator. Before treatment begins, the clinician identifies and assesses skin tumors on the patient, determines required doses of the anti-cancer drugs, and applies local anesthetic to reduce pain. Anti-cancer drugs 106 are injected by syringe 108 into tumor 104 in step 132. Drugs such as Bleomycin and Cisplatin that are typically used for cancer treatment are often highly cytotoxic and, during normal chemotherapy, may move around the patient's body and cause damage to healthy cells and organs outside of the tumor. Moreover, before application of a pulsed electric field to the tumor, cancer cells 120 of tumor 104 are protected from anti-cancer drugs 106 by their cell membrane 122 (step 134). In step 136, probe 116 is used to apply a pulsed E-field generated by PEF generator 112 to tumor 104. In step 138, the applied E-field induces electroporation—the formation of nanopores 124 in cancer cell membrane 122—which in turn allows drugs 106 to enter cancer cell 120 (step 140). The onset of electroporation causes almost all the injected drugs 106 to be absorbed into cancer cells 120 when cell membrane 122 becomes permeable.

Once the E-field is no longer applied, membrane 122 of cancer cell 120 reseals with anti-cancer drug 106 trapped inside, where it can destroy cell 120 (step 142). In addition to inducing cell death, anti-cancer drug 106 is no longer free to move around the patient's body and cause harmful side effects. Moreover, the use of electroporation enables the use of non-cytotoxic drugs such as Calcium which were previously completely impermeable to cancer cell membranes. As a result, ECT using a PEF generator has minimal side effects as compared to traditional therapies such as regular chemotherapy.

Although ECT has relatively minimal side effects, the pain caused from the electric pulses applied to the patient can still be discomforting and may discourage wider adoption of the therapy. The European Standard Operating Procedure for Electrochemotherapy (ESOPE) outlines use of long 100 µs pulses to induce electroporation. Such long pulse lengths can cause much higher levels of pain than other pulse types. Recent trends suggest that use of higher frequency 1 µs to 2 µs bipolar pulses substantially reduces pain while still showing successful response to the therapy. These shorter pulse profiles are commonly referred to as High-Frequency Irreversible and/or Reversible Electroporation (HF-IRE) pulses. Although this disclosure is not limited to generating pulses of any particular length, voltage, or frequency, the description below is primarily in the context of pulses that comply with HF-IRE pulse protocols.

As with any medical treatment, the safety of the patient is of utmost importance. Since the output of the PEF generator is applied directly to human tissue, patient safety and protection must be significant considerations in the generator design. However, the PEF generator must also provide the high voltages (up to 3 kV), current (up to 50 A) and power levels (up to 150 kW) needed to induce electroporation. This creates a significant design challenge, as a generator that outputs such high-power levels could potentially generate dangerous outputs that are applied to the patient. Accordingly, one aspect of this disclosure is a firmware independent over-energy protection (OEP) circuit that limits the energy that can be supplied by the PEF generator, even in the case of a firmware failure such as a frozen microcontroller.

Again, while described for exemplary purposes in a medical context, this disclosure is not so limited, and there are many other applications and contexts in which it may be desirable or necessary to limit the energy that can be output by a PEF generator. In this regard, the OEP circuit of this disclosure is suitable for use with various PEF generators in a medical or non-medical context having different output voltages, currents, and pulse widths, and functions to limit the supplied energy to a level that is appropriate and safe for the application in which the PEF generator is operating. In an ECT application, for example, an output of 50 J or less is generally considered safe and not likely to cause thermal damage to human tissue.

In skin ECT, high voltage outputs on the order of about 400V are needed to create the strong E-fields needed for successful electroporation. High currents of up to 20 A can be induced when treating a large volume of tissue with strong E-fields. Because tumors vary in terms of volume, water content, and level of necrosis, the output current varies on a tumor-by-tumor basis. In general, the deeper the needles on probe 116 must penetrate the tumor, the more current will be drawn. Applying a 400V, 20 A pulse delivers a very high peak power level from the PEF generator of 8 kW. While delivering an 8 kW DC power level to a patient seems unsafe, this is the required instantaneous power needed to electroporate skin cancer cells in tumors. For this reason, PEF generators in an ECT application are generally configured to generate a pulsed output that delivers the high-peak power level to the tumor for only a very small window of time in a burst of energy. The PEF generator delivers no output power for the remainder of the time as it is recharging its internal energy storage capacitor banks.

Figure 3A:
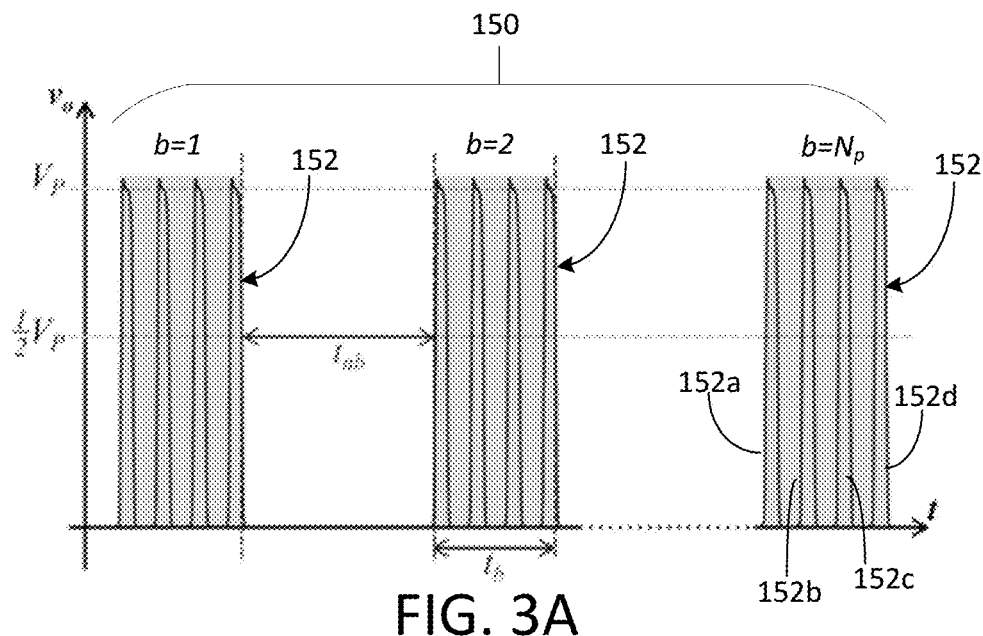
FIG. 3A is a graph illustrating an exemplary burst train waveshape for a unipolar output, in accordance with this disclosure.
Figure 3B:
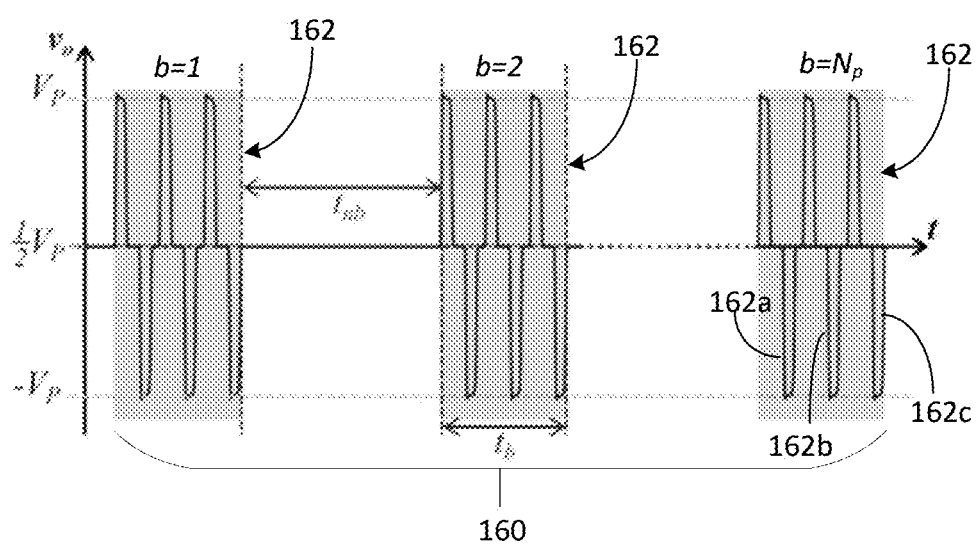
FIG. 3B is a graph illustrating an exemplary burst train waveshape for a bipolar output, in accordance with this disclosure.

The typical pulsed output of a PEF generator is a constant voltage burst train. A burst is a term commonly used to refer to a finite train of pulses. As such, a burst train is a series of spaced bursts, wherein each burst within the burst train is itself composed of a finite train of pulses. Different pulse train waveshapes and burst train waveshapes exist. FIG. 3A depicts the waveshape of a unipolar burst train 150, such as that used in the standard ESOPE protocol for skin ECT, and FIG. 3B depicts the waveshape of a bipolar burst train 160, such as that used in the more recently adopted HF-IRE protocol. Unipolar burst train 150 comprises 1. . . . $N_b$ bursts 152, and bipolar burst train 160 comprises 1. . . . $N_b$ bursts 162.

Each burst 152, 162 within burst trains 150, 160 is itself a finite pulse train. In FIG. 3A, for example, each burst 152 is a pulse train comprising four unipolar pulses 152a . . . 152d, and in FIG. 3B, each burst 162 is a pulse train comprising three bipolar pulses 162a . . . 162c. In FIGS. 3A-B, the total number of bursts within the burst train is denoted $N_b$, the time interval $t_b$ denotes the burst width, and the time interval $t_{nb}$ denotes the time between bursts within a burst train (also referred to as the time until the next burst). It should be noted that FIGS. 3A-3B are not to scale. For illustration purposes, the time intervals in FIGS. 3A-B are shown such that $t_b \approx t_{nb}$; in reality, however, the time between bursts $t_{nb}$ is orders of magnitude larger than the burst width $t_b$. For example, the ratio of $t_b:t_{nb}$ is typically at least 1:500 and may be 1:1000 or more. As a result, the average power delivered is orders of magnitude lower than the peak power delivered during a burst.

Figure 4:
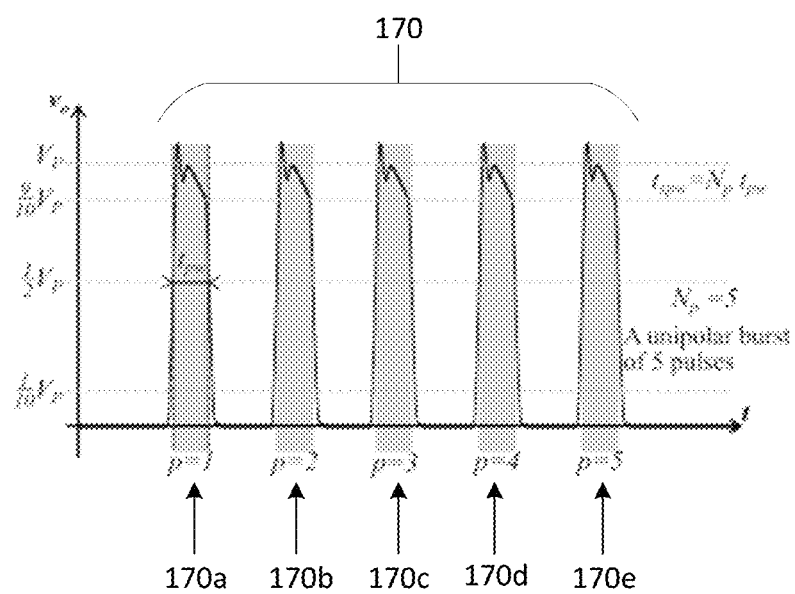
FIG. 4 is a graph illustrating an exemplary unipolar pulse train burst, in accordance with this disclosure.

A useful timing parameter in describing burst train waveshapes is the summated pulse width $t_{spw}$ within a burst as depicted in example burst 170 of FIG. 4. Burst 170 comprises five pulses 170a . . . 170e. The pulse width of a single pulse is $t_{pw}$, and the total number of pulses within a burst is $N_p$. In the example of FIG. 4, $N_p$=5. For the unipolar pulse train burst 170 of FIG. 4, the summated pulse width is given by $t_{spw}=N_p t_{pw}$. For a bipolar pulse train burst, the summated pulse width $t_{spw}=2N_p t_{pw}$. The ratio of $t_{spw}$ to $t_{nb}$ mirrors the ratio of the generator peak power to the generator average power delivered during treatment.

Example pulse parameters for a typical skin ECT HF-IRE pulsed output of a PEF generator are set forth below in TABLE 1:

| PARAMETER | VALUE |
|---|---|
| Burst Type | Symmetrical Bipolar |
| Pulse Width $t_{pw}$ | 2 μs |
| Pulse Period | 6.2 μs |
| Time Between Bursts $t_{nb}$ | 100 ms |
| Number of Pulses $N_p$ | 50 |
| Summated Pulse Width $t_{spw}$ | 200 μs |
| Ratio of $t_{spw}:t_{nb}$ | 1:500 |
| Peak Power $P_{peak}$ | 8 kW |
| Average Power $P_{avg}$ | 16 W |
| Number of Bursts $N_b$ | 30 |
| Burst Train Width | 3 s |

In the example of TABLE 1, the peak power $P_{peak}$ during treatment can be as high as about 8 kW, however, the ratio of $t_{spw}:t_{nb}$ is 1:500. Thus, the maximum average power delivered during a treatment is only about 40 W. Most tumors will draw less current than the maximum generator current, so the average power delivered will vary on a tumor-by-tumor basis from about 10 W to about 40 W. Regarding the example of TABLE 1, it should be noted that the parameter values set forth are for exemplary purposes only and that the actual values may vary widely depending on the application.

Continuing with the example application of electroporation, the PEF generator must create a well-shaped pulsed square-wave output during the burst interval to induce successful electroporation. Different circuit topologies and architectures are suitable for producing this output; however, they generally will contain an energy storage capacitor bank and a switch network to apply the energy stored in the capacitor bank across the patient in a pulsed fashion.

Figure 5:
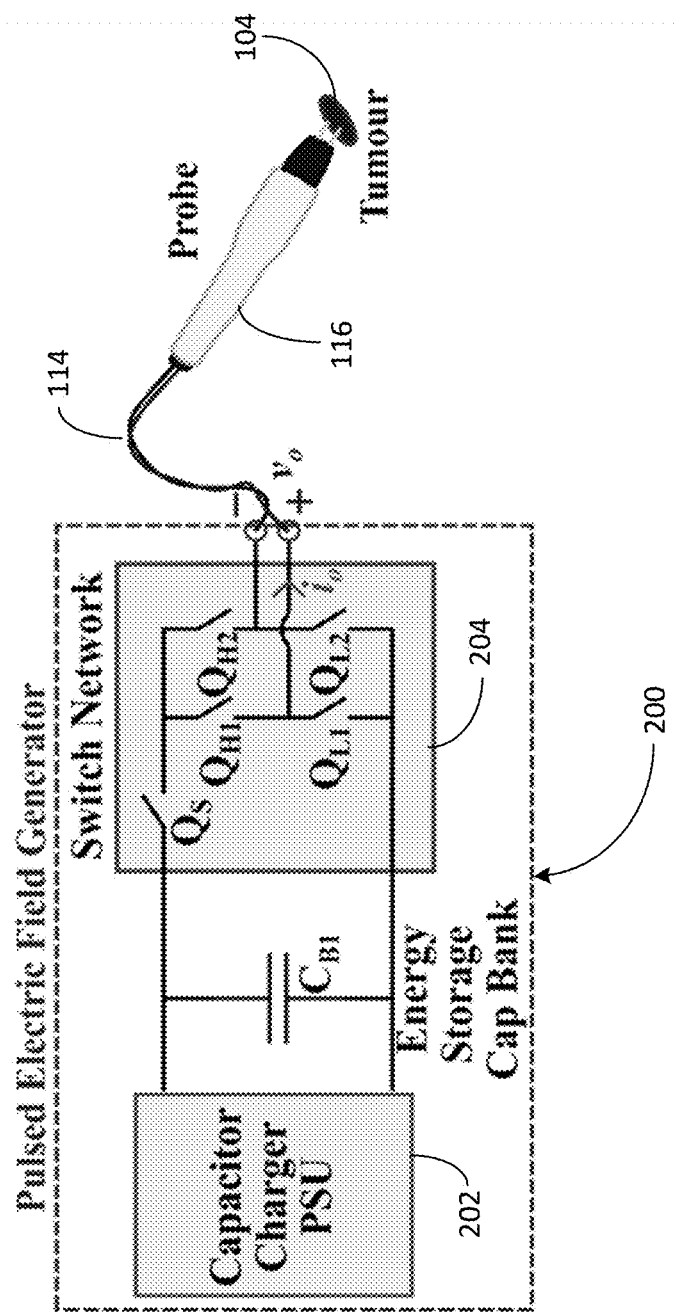
FIG. 5 is a diagram of an exemplary circuit topology for a power supply using one capacitor bank, in accordance with this disclosure.

A simplified exemplary circuit topology for a power supply 200 that may be operated as a PEF generator is set forth in FIG. 5. A capacitor charger power supply unit (PSU) 202 is used to charge a large capacitor bank denoted as $C_{B1}$. Switch network 204 comprising series switch $Q_s$ and an H-bridge circuit comprising switches $Q_{H1} Q_{L1}$, $Q_{H2}$, and $Q_{L2}$ acts as a pulse generator and creates pulsed output voltage $v_o$. In one example, pulsed output $v_o$ is applied to twisted-pair cable 114 and probe 116, which applies the output voltage $v_o$ across the tumor volume, which induces a pulsed output current $i_o$ to flow in tumor 104. As previously described, the output connection of power supply 200 to cable 114 and probe 116 is for exemplary purposes of illustration only; the pulsed output voltage $v_o$ and pulsed output current $i_o$ generated by power supply 200 could be used in a wide variety of other applications besides medical electroporation. It should be recognized that the series switch, Qs, may be realized by multiple switches (arranged in series and/or parallel) that are simultaneously switched to effectuate the function of a single switch. For example, the series switch Qs may be realized by multiple switches (e.g., field effect transistors) arranged in series and the multiple switches are all closed at the same time and opened at the same time. Arranging multiple switches in series (to realize Qs) enables low-cost switches, that are each rated for a relatively low voltage, to be used in a high voltage application. Similarly, multiple switches (rated for relatively low current) may be arranged in parallel and switched simultaneously in a high current application.

The capacitor bank capacitance $C_{B1}$ is set to create clean square wave pulses during a burst. This is achieved by setting the capacitor bank capacitance $C_{B1}$ to be large enough that the voltage drop that occurs during the burst is relatively small compared to the setpoint voltage. In this regard, the circuit equation (1) for an ideal capacitor is:

$$i_c(t) = C \frac{dV(t)}{dt} \tag{1}$$

In equation (1), $i_c(t)$ is the current through the capacitor as a function of time, C is the capacitance, and V(t) is the voltage across the capacitor as a function of time. In other words, the current through an ideal capacitor is directly proportional to the time derivative of the voltage across it. Thus, if the voltage across the capacitor is changing rapidly with time, the current through the capacitor will also be large, whereas if the voltage across the capacitor changes very little with time, then the current through the capacitor will be small.

Equation (1) can be applied to the capacitor bank voltage during a burst to derive equation (2) for the voltage drop $\Delta V$ on the capacitor bank during a burst as follows:

$$\Delta V = \frac{t_{spw} I_o}{C_{B1}} \tag{2}$$

The capacitance value $C_{B1}$ of the capacitor bank is selected so that the percentage of the voltage drop across the capacitor bank to the setpoint voltage $V_P$ is low, per equation (3):

$$C_{B1} = \frac{t_{spw} I_o}{V_p (\Delta V / V_P)} \tag{3}$$

The energy stored in any capacitor is given by $$E = \frac{1}{2} C V^2.$$

Applying this equation to the PEF generator capacitor bank, the energy stored in the capacitor bank during treatment is given by equation (4):

$$E_{B1} = \frac{1}{2} \frac{t_{spw} I_o}{V_p (\Delta V / V_P)} V_P^2 \tag{4}$$

The energy delivered from the capacitor bank during a burst $E_b$ can be determined by:

$$E_b = t_{spw} I_o V_P \tag{5}$$

Combining equations (4) and (5) yields the ratio of the energy stored in the capacitor bank ($E_{B1}$) to the ratio of the maximum energy delivered during a burst ($E_b$):

$$E_{B1}:E_b = \frac{1}{2} \frac{t_{spw}I_o}{V_p(\Delta V/V_P)} V_p^2 : t_{spw}I_o V_P \quad (6)$$

$$E_{B1}:E_b = \frac{1}{2} \frac{V_P}{\Delta V} : 1$$

$$E_{B1}:E_b = V_P : 2\Delta V$$

A suitable percentage of $\Delta V/V_P$ can be anywhere from 1% to 6% to get a clean pulsed square wave output. Assume, in one example, that $\Delta V/VP=3\%$ in a skin ECT HF-IRE application. In this case, the capacitance value $C_{B1}$ of the capacitor bank can be set per equation (3):

$$C_{B1} = \frac{t_{spw}I_o}{V_p(\Delta V/V_P)} = \frac{(0.2 \text{ ms})(20A)}{(400V)(3\%)} = 0.333 \text{ mF} \quad (7)$$

In the same example (equation 7), the ratio of $E_{B1}:E_b$ is given by equation (8):

$$E_{B1}:E_b = 17:1 \quad (8)$$

Thus, there is an inherent risk in the PEF generator circuit topology that a failure could occur in the switch network or in the control of the switch network that releases all the energy stored in the capacitor bank, creating the possibility of damaging the patient tissue or causing other harm. For this reason, this disclosure provides a novel over-energy protection (OEP) circuit that ensures that excessive energy cannot be released from the capacitor bank of the PEF generator.

Figure 6:
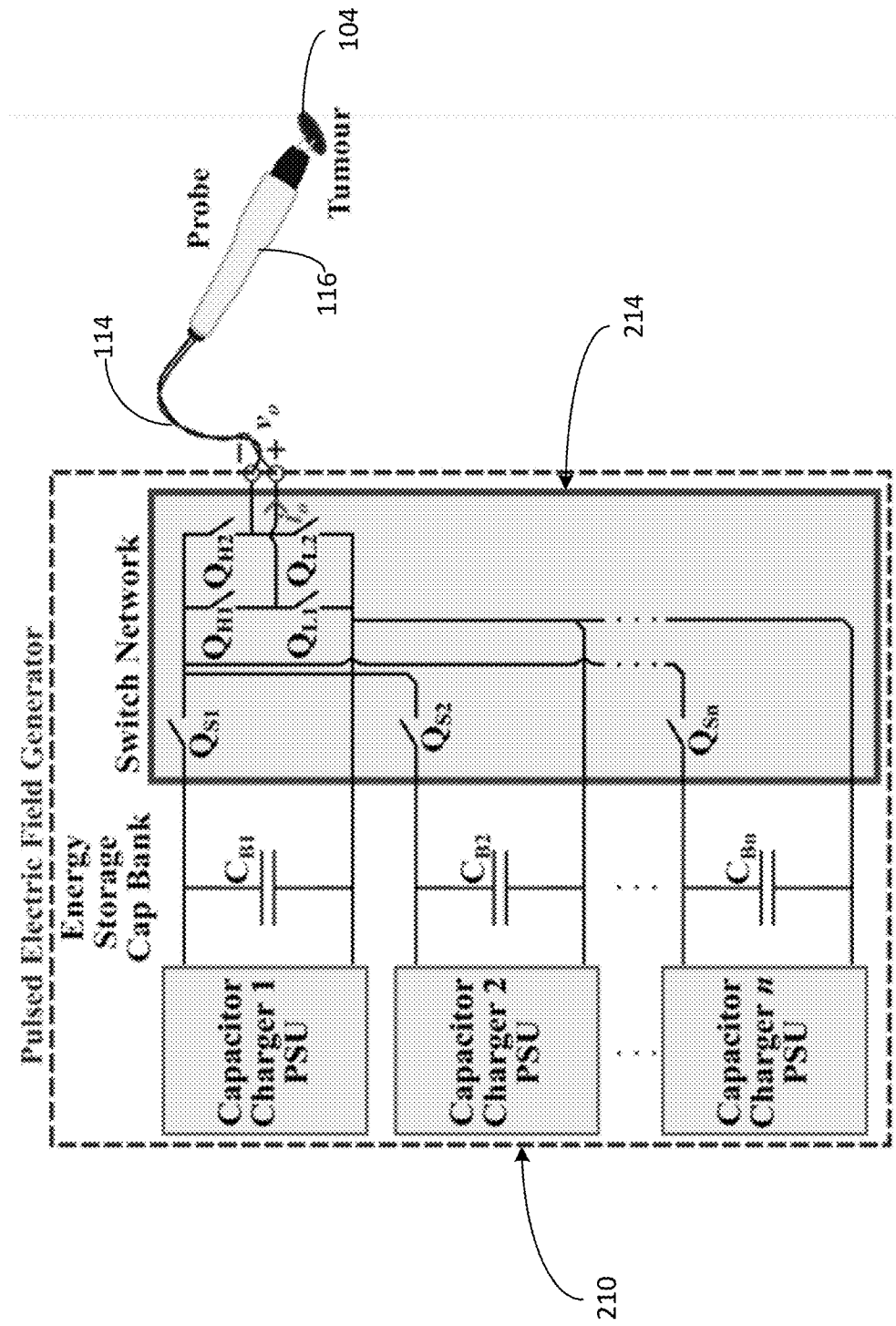
FIG. 6 is a diagram of an exemplary circuit topology for a power supply using multiple capacitor banks, in accordance with this disclosure.

In some applications, PEF generators may employ multiple capacitor banks. In a medical PEF application, for instance, multiple capacitor banks may be applied to the patient in a sequential manner through a larger switch network. An exemplary and simplified circuit topology of a power supply 210 using multiple capacitor banks is depicted in FIG. 6. Power supply 210 comprises multiple (n) capacitor banks $C_{B1}$, $C_{B2}$ . . . . $C_{Bn}$ that are charged by a corresponding number (n) of capacitor charger power supply units (PSUs) 1, 2 . . . n. Power supply 210 further comprises switch network 214 comprising series switches $Q_{S1}$, $Q_{S2}$ . . . . $Q_{Sn}$ that switch capacitor banks $C_{B1}$, $C_{B2}$ . . . . $C_{Bn}$ in and out of use. Switch network 214 further comprises an H-bridge circuit comprising switches $Q_{H1}$, $Q_{L1}$, $Q_{H2}$, and $Q_{L2}$ that is coupled to one of capacitor banks $C_{B1}$, $C_{B2}$ . . . . $C_{Bn}$ at a time, based on the settings of switches $Q_{S1}$, $Q_{S2}$ . . . . $Q_{Sn}$, to act as a pulse generator and create pulsed output voltage $v_o$. In one example, pulsed output $v_o$ is applied to twisted-pair cable 114 and probe 116, which applies the output voltage $v_o$ across tumor 104 and induces a pulsed output current $i_o$ to flow in tumor 104.

Figure 7:
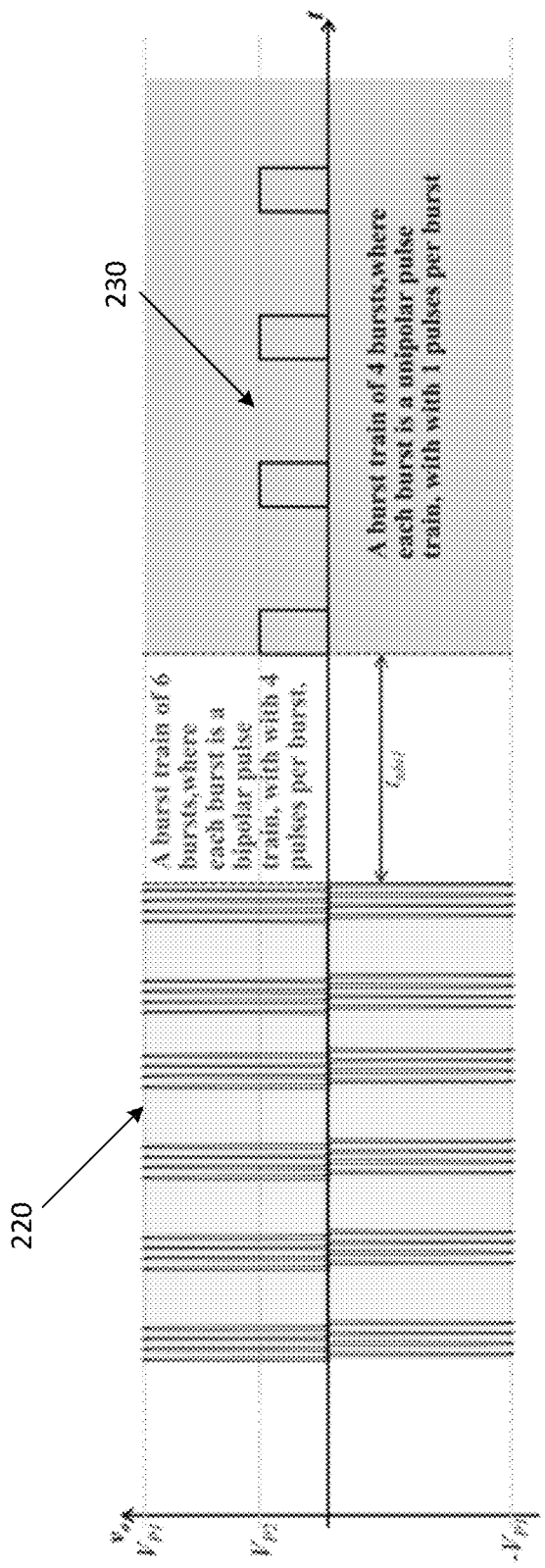
FIG. 7 is a graph illustrating an exemplary series burst train output from a power supply using multiple capacitor banks, in accordance with this disclosure.

The multiple capacitor bank topology of FIG. 6 enables output of a series of burst trains having different waveform shapes. For example, power supply 210 of FIG. 6 can output a high-voltage HF-IRE burst train sequentially followed by a lower voltage, lower frequency unipolar pulse train, where the pulse parameters of each burst train are targeted at achieving different biological phenomenon in the tissue. An example of this type of series burst train output is shown in FIG. 7, where a burst train 220 of six bursts, with four bipolar pulses per burst, is followed by a burst train 230 of four bursts, with one unipolar pulse per burst. For this type of PEF generator topology, it is important that the over-energy protection (OEP) circuit adequately limits the energy delivered by any individual capacitor bank. The OEP circuit of this disclosure, as described below, is suitable for both the single capacitor bank topology of FIG. 5 as well as the multiple capacitor bank topology of FIG. 6.

Figure 8:
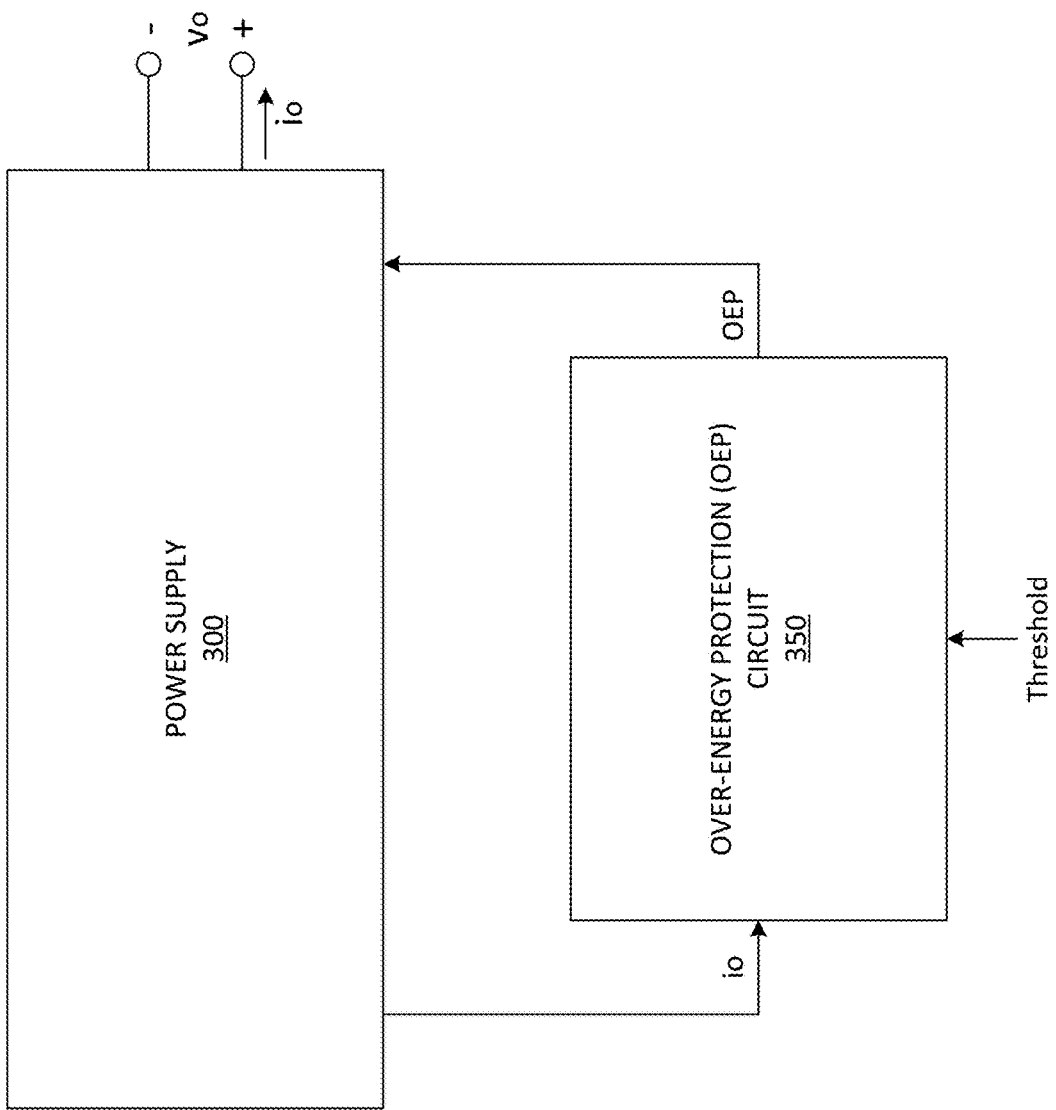
FIG. 8 is a high-level exemplary block diagram of a power supply that includes an over-energy protection (OEP) circuit, in accordance with this disclosure.

FIG. 8 is a high-level exemplary block diagram of an energy delivery system comprising a power supply 300 coupled to an over-energy protection (OEP) circuit 350, in accordance with this disclosure. Though power supply 300 and OEP circuit 350 are shown as separate blocks in FIG. 8 and in the following figures, power supply 300 and OEP circuit 350 may be formed as a unitary component. For example, OEP circuit 350 may be formed as an integral part of power supply 300. Alternatively, OEP circuit 350 could be formed as a separate component from power supply 300. Thus, this disclosure encompasses an energy delivery system that includes both a power supply and an OEP circuit, as well as a stand-alone OEP circuit or component that may be coupled to and used in conjunction with a power supply.

As previously described, power supply 300 may operate as a PEF generator to produce a pulsed output voltage $v_o$ and a pulsed output current $i_o$. OEP circuit 350 senses the output current $i_o$ of power supply 300 and generates a sensed current signal representative of the output current $i_o$. A charge delivered signal is then generated from the sensed current signal that is representative of the total charge in ampere-seconds delivered by the power supply over a time interval, typically the duration of a burst generated by power supply 300. The total charge delivered is indicative of the energy imparted at the output of the power supply 300, and if the total charge delivered exceeds a threshold level of charge delivered, a fault signal designated as OEP is triggered and used to disable power supply 300. In the medical context, the result is that the patient is protected from exposure to harmful energy levels.

Figure 9:
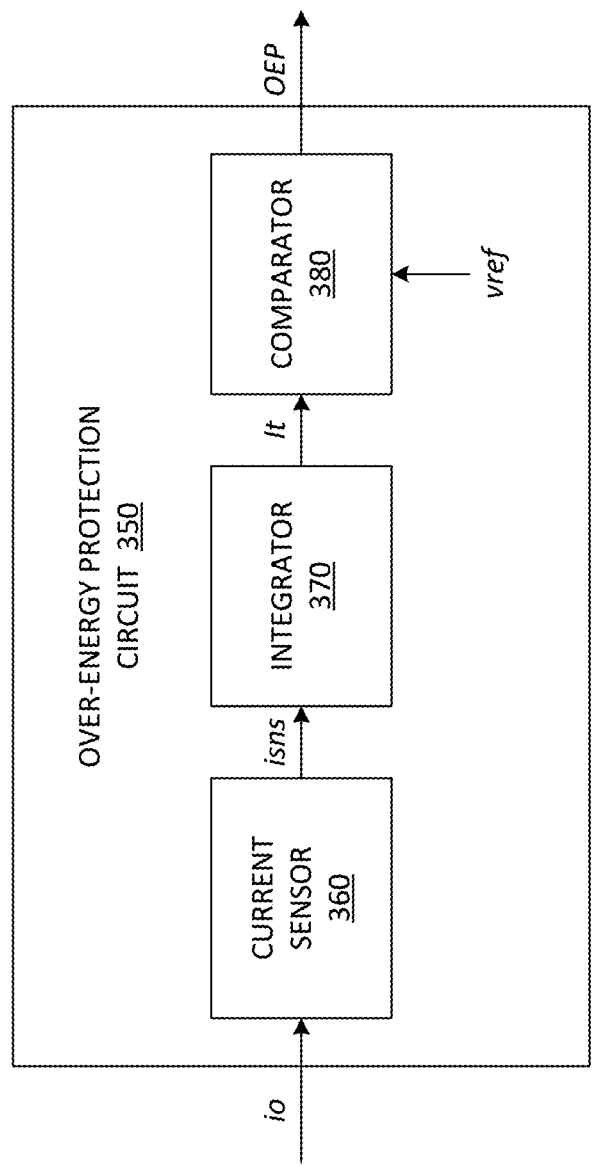
FIG. 9 is a high-level exemplary block diagram of the over-energy protection (OEP) circuit of FIG. 8, in accordance with this disclosure.

FIG. 9 is a high-level exemplary block diagram showing further details of over-energy protection (OEP) circuit 350, in accordance with this disclosure. OEP circuit 350 includes current sensor 360, integrator 370, and comparator 380. Current sensor 360 senses the output current $i_o$ of power supply 300 and produces the sensed current signal $i_{sns}$ (typically a voltage) that is representative of the output current $i_o$. The sensed current signal $i_{sns}$ is coupled to integrator 370 which integrates the sensed current signal $i_{sns}$ to produce the charge-delivered signal, It, that represents the total charge in amp-seconds delivered by power supply 300 over a time interval, typically the duration of a burst generated by power supply 300. The charge-delivered signal, It, may be produced as a varying voltage signal that is electrically coupled to comparator 380 and compared with a threshold that is set by a reference voltage $v_{ref}$. If It exceeds the threshold set by $v_{ref}$, the output signal OEP of comparator 380 is triggered high, indicating a fault condition (over delivery of energy) and causing power supply 300 to latch to an OFF state and be disabled. The threshold established by $v_{ref}$ may be configurable to enable an operator of the power supply 300 to adjust the threshold based upon the application. It is also contemplated that the threshold may be fixed (to produce a fixed level for $v_{ref}$) in advance based upon empirical studies that are used to establish safe levels of energy. There may also be multiple fixed thresholds that may be stored in non-volatile memory of the power supply 300 and each threshold is associated with a particular voltage level for $v_{ref}$.

Figure 10:
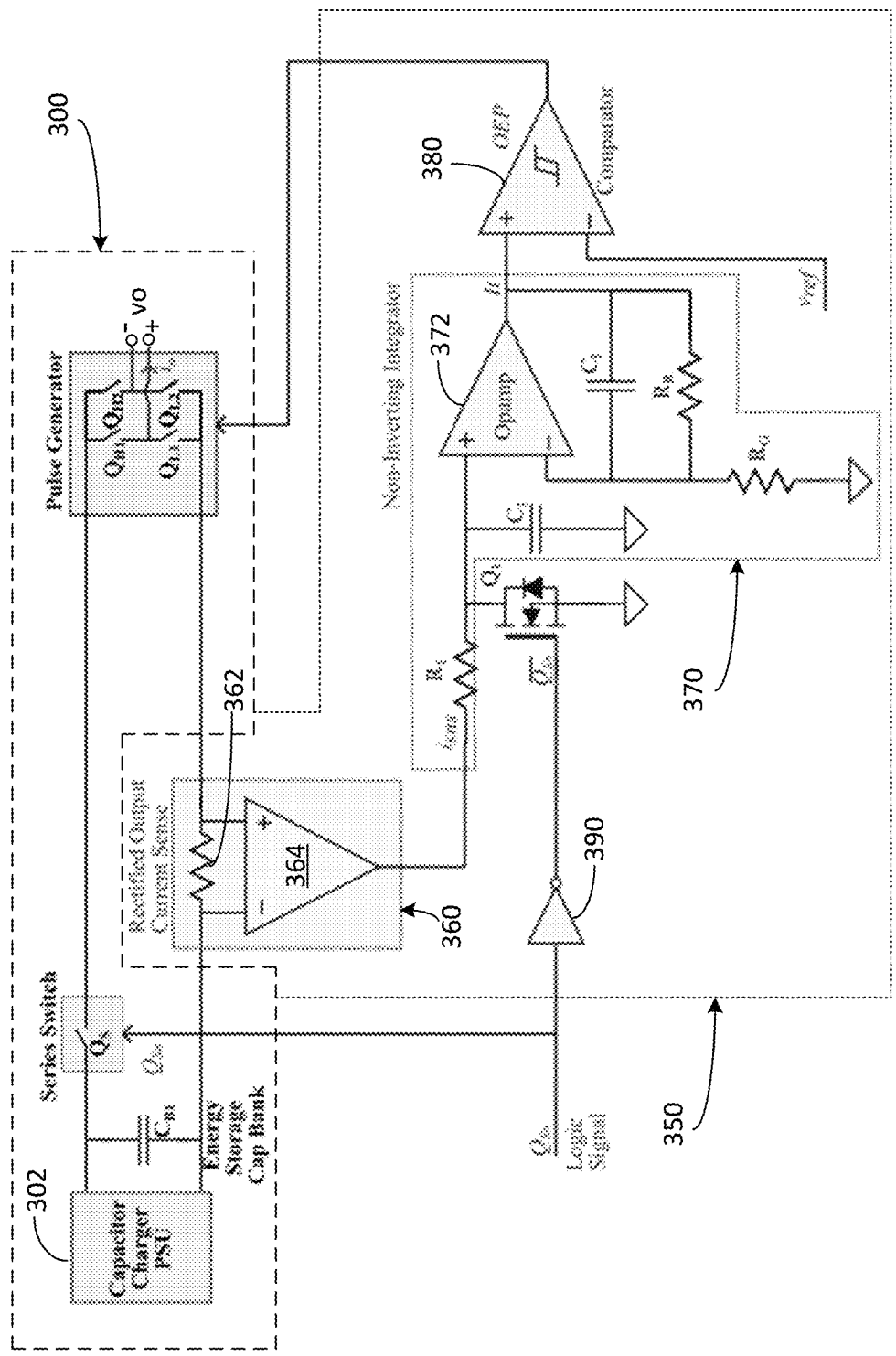
FIG. 10 is an exemplary circuit diagram of the power supply and the OEP circuit, in accordance with this disclosure.

FIG. 10 is an exemplary and more detailed circuit diagram of power supply 300 and OEP circuit 350, in accordance with this disclosure. Power supply 300 may be configured with a single capacitor bank, as in FIG. 5, or with multiple capacitor banks, as in FIG. 6. In FIG. 10, power supply 300 is shown as configured with one energy storage capacitor bank CB1. Capacitor charger power supply unit (PSU) 302 charges capacitor bank $C_{B1}$. Series switch $Q_s$ is open when power supply 300 is not generating a pulsed output (i.e., while capacitor bank $C_{B1}$ is recharging), and is closed when power supply 300 is generating a pulsed output. Pulse generator (H-bridge) 304 comprises switches $Q_{H1}$, $Q_{L1}$, $Q_{H2}$, and $Q_{L2}$ and generates pulsed output voltage $v_o$ and pulsed output current $i_o$.

OEP circuit 350 comprises current sensor 360, integrator 370, and comparator 380. In the example of FIG. 10, current sensor 360 takes the form of a rectified output current sensor. Rectified output current sensor 360 comprises shunt resistor 362 placed in the path of the output current $i_o$ of power supply 300 and coupled between the input terminals of rectifier 364. Shunt resistor 362 is a very low value resistor to minimize impact on the circuit and is also a precision resistor to ensure accurate measurements. The output current $i_o$ flowing through resistor 362 creates a small voltage drop across the resistor that is directly proportional to current flow as per Ohm's law. This voltage drop is provided across the input terminals of rectifier 364, which is configured as an operational amplifier. Rectifier 364 produces a rectified and amplified (if needed) output signal $i_{sns}$ that is proportional to the absolute value of the sensed current. In particular, $i_{sns}=H_i|i_o|$, where $H_i$ is the sensor gain of rectifier 364.

While current sensor 360 is implemented as a rectified output current sensor in the configuration of FIG. 10, alternative current sensors may be used. For example, current sensor 360 could alternatively be a Hall effect sensor, a current transformer, an inductive sensor, or any other appropriate type of current sensor.

The sensed current signal $i_{sns}$ output by current sensor 360 is coupled to integrator 370. In the example of FIG. 10, integrator 370 is a non-inverting integrator. Integrator 370 comprises input resistor $R_1$ connected between the output of current sensor 360 and the non-inverting terminal of operational amplifier (op amp) 372. Capacitor $C_1$ is connected between the non-inverting terminal of op amp 372 and ground. Integrating capacitor $C_I$ and reset resistor $R_R$ are connected in parallel between the output terminal of op amp 372 and the inverting terminal of op amp 372. Resistor $R_G$ is coupled between the inverting terminal of op amp 372 and ground.

Input capacitor $C_1$, in combination with input resistor $R_1$, forms a high pass filter at the non-inverting input to op amp 372. Integrating capacitor $C_I$ is connected in a feedback loop between the output and inverting input of op amp 372 and is responsible for the integrating behavior of circuit 370. It accumulates charge over time in response to the sensed current signal $i_{sns}$ and provides an output signal, It, (a charge-delivered signal) that is the time integral of the input signal $i_{sns}$. The output signal, It, in FIG. 10 is produced as a voltage signal with a magnitude that is proportional to the amount of charge delivered over a time interval. Reset resistor $R_R$ is also connected in the feedback loop, parallel to integrating capacitor $C_I$, and provides a controlled path for the integrating capacitor $C_I$ to discharge, effectively "resetting" the integrator.

The charge-delivered signal It output by integrator 370 is provided to the non-inverting input of comparator 380, and a reference voltage $v_{ref}$ is provided to the inverting input of comparator 380 to establish the charge-delivered threshold. So long as the voltage signal representing It is less than the voltage $v_{ref}$ (representing the charge-delivered threshold) the output signal OEP is a logical low, no fault is triggered, and power supply 300 continues normal operation. When the voltage (representing charge-delivered) at the non-inverting input (It) exceeds the voltage (representing the charge-delivered threshold) at the inverting input ($v_{ref}$), the output signal OEP of comparator 380 is triggered to a logical high, which indicates a fault and causes power supply 300 to latch to an OFF state and be immediately disabled, thereby preventing excessive energy output from power supply 300.

Figure 11:
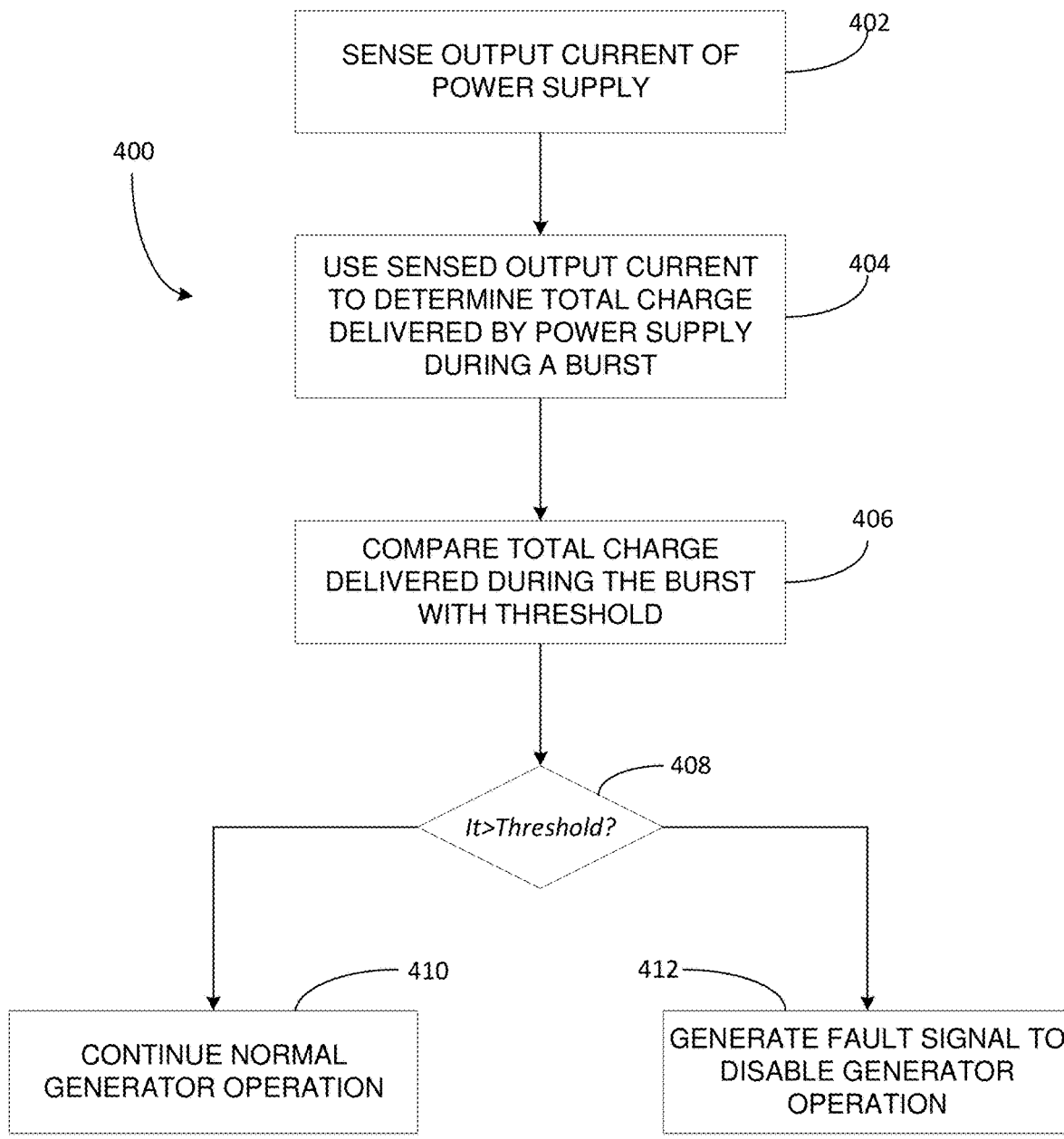
FIG. 11 is a flow diagram of a method for limiting the energy delivered by a power supply, in accordance with this disclosure.

FIG. 11 is a flow diagram of a method 400 for limiting the energy delivered by power supply 300. In step 402, the output current $i_o$ of power supply is sensed by OEP circuit 350. In one implementation, sensor 360 of OEP circuit 350 senses the output current $i_o$ of power supply 300 and produces a sensed current signal $i_{sns}$ that is representative of the output current $i_o$. Sensor 360 may be, for example, a rectified output current sensor. In step 404, the sensed output current is used to determine the total charge delivered by power supply 300 over time interval, typically the duration of a burst generated by power supply 300. In one implementation, integrator 370 integrates the sensed current signal $i_{sns}$ to determine the charge delivered by power supply 300 in amp-seconds. Integrator 370 may be, for example, a non-inverting integrator. In step 406, the total charge delivered by power supply 300 during the burst is compared with a charge-delivered threshold set by reference voltage $v_{ref}$. In one implementation, step 406 is carried out by comparator 380. If the charge delivered by power supply 300 is less than the threshold set by the reference voltage $v_{ref}$, normal operation of power supply 300 continues (step 410). If the total charge delivered by power supply 300 is greater than the threshold corresponding to the reference voltage vref, a fault signal is generated to disable operation of power supply 300 (step 412).

To enable OEP circuit 350 to be used in conjunction with a multiple capacitor bank generator topology, transistor Q1 and inverter 390 may be provided. The gate of Q1 is controlled by a logic signal denoted by $\overline{Q_{Sn}}$, where $\overline{Q_{Sn}}$ is the inverted logic signal (via inverter 390) of the logic signal $Q_{Sn}$ used to drive the series switch $Q_{Sn}$ connected to the relevant capacitor bank $C_{Bn}$ (see, e.g., FIG. 6). For a multiple capacitor bank power supply, a different OEP circuit is used for each capacitor bank. When a capacitor bank is being used by the power supply to deliver pulses, the OEP circuit is actively producing the charge-delivered signal It as the integral of the rectified current to represent delivered charge. When the capacitor bank is not being used by the power supply to deliver pulses, the associated series switch $Q_{Sn}$ will be open, hence the logic signal $\overline{Q_{Sn}}$ applied to the gate of Q1 is high (since $Q_{Sn}$ is low), which effectively disables the OEP circuit for that capacitor bank. In this scenario, the energy is no longer limited by the OEP circuit, but instead is limited to 0 J by the fact that the series switch for that capacitor bank is open.

Figure 12A:
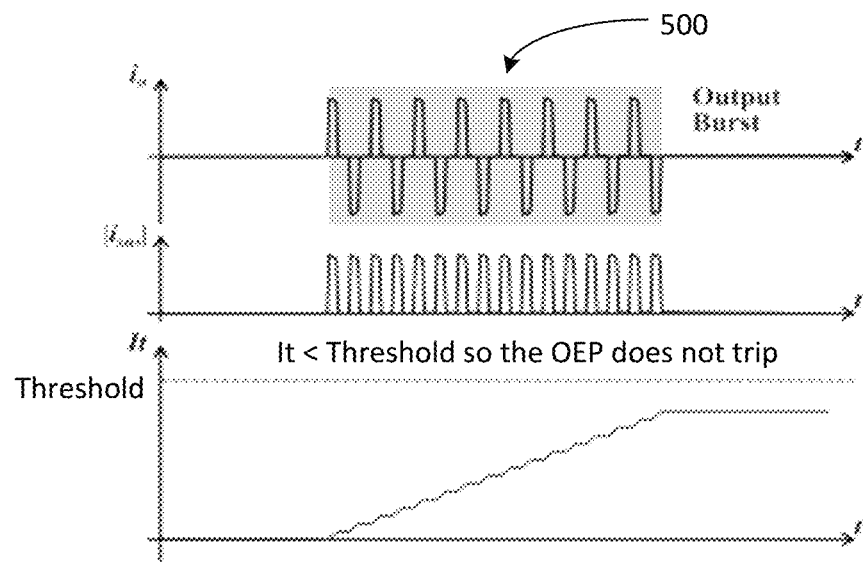
FIG. 12A is a graph illustrating the waveshapes of the generator output current io, the sensed rectified current |isns|, and the amp-seconds integral It over the time interval of a single burst, in accordance with this disclosure.
Figure 12B:
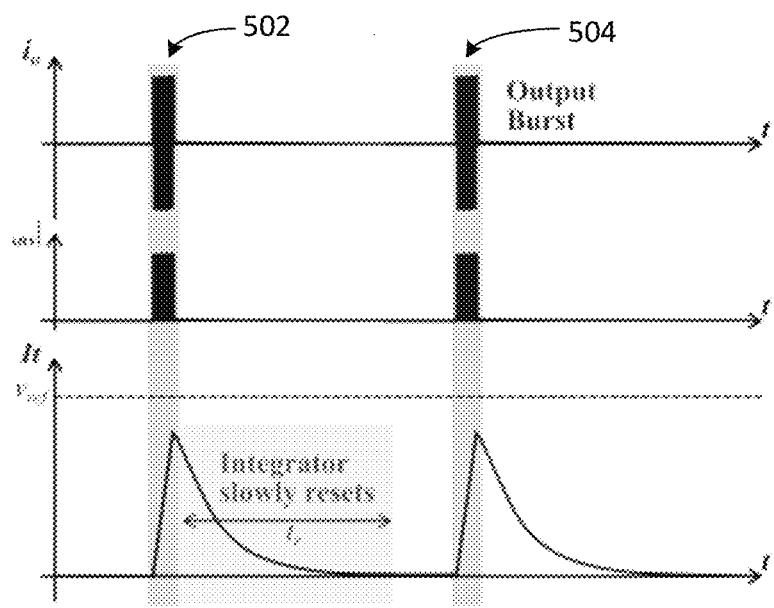
FIG. 12B is a graph illustrating the waveshapes of the generator output current io, the sensed rectified current |isns|, and the amp-seconds integral It over the time interval of two bursts, in accordance with this disclosure.

Normal operation of power supply 300 and OEP circuit 350, with no OEP fault occurring, is depicted in FIGS. 12A-B. FIG. 12A is a graph illustrating the waveshapes of the output current io, the sensed rectified current |isns| and the amp-seconds integral It over the time interval of a single burst 500. The waveshape of output current burst 500 in this example is a bipolar waveshape similar to the HF-IRE protocol. As can be seen in FIG. 12A, in this example, output burst 500 is comprised of eight pulses. As burst 500 progresses, the charge-delivered signal, It, ramps up from zero as the sensed rectified current signal |isns| is integrated to provide a measure of the total charge delivered by power supply 300 over the time interval of burst 500. As one of ordinary skill in the art will appreciate in view of this disclosure, the charge delivered during the time interval is indicative of the energy imparted to a load (e.g., a human or other sensitive load) at the output of the power supply 300; thus, total charge may be used as a parameter to limit energy imparted to the load. When burst 500 is complete, io drops to 0 A, so the integrator holds its value. Since the value of It never exceeds the threshold represented by vref, no OEP fault is triggered, and the operation of power supply 300 continues as normal.

FIG. 12B shows the same types of signals as FIG. 12A, but over a longer time interval that comprises two bursts 502 and 504. As described above, and as seen in FIG. 12B, the time interval between bursts 502 and 504 is orders of magnitude greater than the duration of bursts 502 and 504. As each of bursts 502 and 504 progresses, the charge-delivered signal It ramps up from zero as the sensed rectified current signal |isns| is integrated to provide a measure of the total charge delivered (which is indicative of total energy delivered) by power supply 300 over the time intervals of bursts 502 and 504. Since the value of It representing charge-delivered never exceeds vref (representing the charge-delivered threshold), no OEP fault is triggered, and the operation of power supply 300 continues as normal.

In operation, the integrator 370 resets during the time interval between bursts. Reset resistor $R_R$ is connected in the feedback loop of integrator 370, parallel to integrating capacitor $C_I$, and provides a controlled path for integrating capacitor $C_I$ to discharge, effectively resetting integrator 370. In this regard, reset resistor $R_R$ is set to a value that allows capacitor $C_I$ to slowly discharge in the interval before the next burst occurs. This is shown in FIG. 12B as a slow ramp down of the integrated signal It after it reaches its peak at the end of bursts 502 and 504. The time that it takes for integrator 370 to reset is denoted as $t_r$ in FIG. 12B. For proper operation, reset resistor $R_R$ may be selected to ensure that the reset time $t_r$ is always less than the minimum time to the next burst $t_{nb}$, i.e., $t_r < t_{nb}$.

Figure 13:
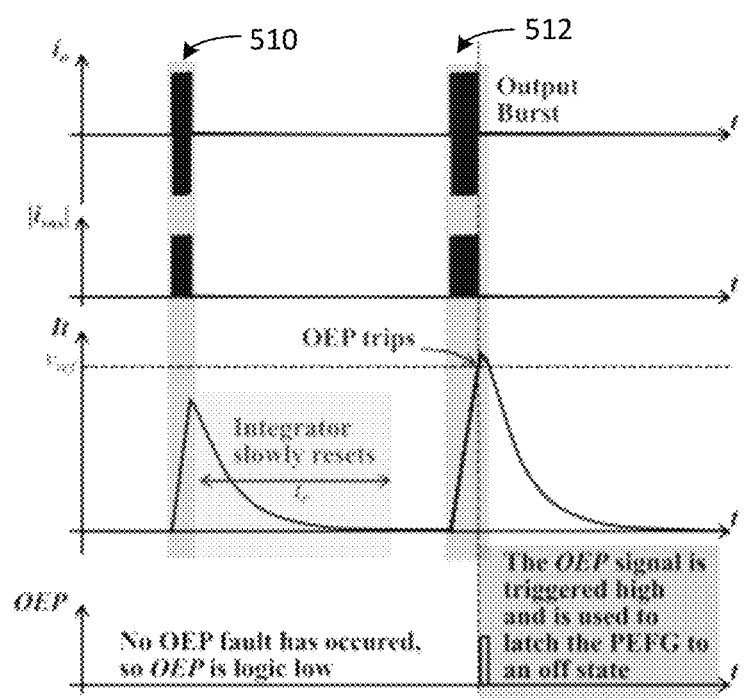
FIG. 13 is a graph illustrating the waveshapes of the generator output current io, the sensed rectified current |isns|, the amp-seconds integral It, and the OEP signal over the time interval of two bursts, with a fault occurring during the second burst, in accordance with this disclosure.

FIG. 13 illustrates the case when an OEP fault occurs. FIG. 13 shows the waveshapes of the generator output current io, the sensed rectified current |isns|, the amp-seconds integral It, and the OEP signal over the time interval of two bursts 510 and 512, with a fault occurring during the second burst 512. Over the time interval of first burst 510, It<Vref, so the output of comparator 380 remains low and no fault is triggered. Normal operation of power supply 300 continues and integrator 370 slowly resets during the interval before the next burst 512 in the burst train is delivered by discharging integrating capacitor $C_I$ through reset resistor $R_R$.

During the next output burst 512, excessive energy is delivered by power supply 300. In particular, as can be seen in FIG. 13, burst 512 is longer than burst 510 and causes excess energy to be delivered. This may be caused by a firmware failure, an internal component failure that has causes the control signals of power supply 300 to deliver excessive energy, or some other reason. Once It exceeds Vref, the signal OEP output by comparator 380 is triggered to a logical high state which causes power supply 300 to immediately latch to an OFF state. Thus, power supply 300 is immediately disabled to prevent any harm from over delivery of energy.

Figure 14:
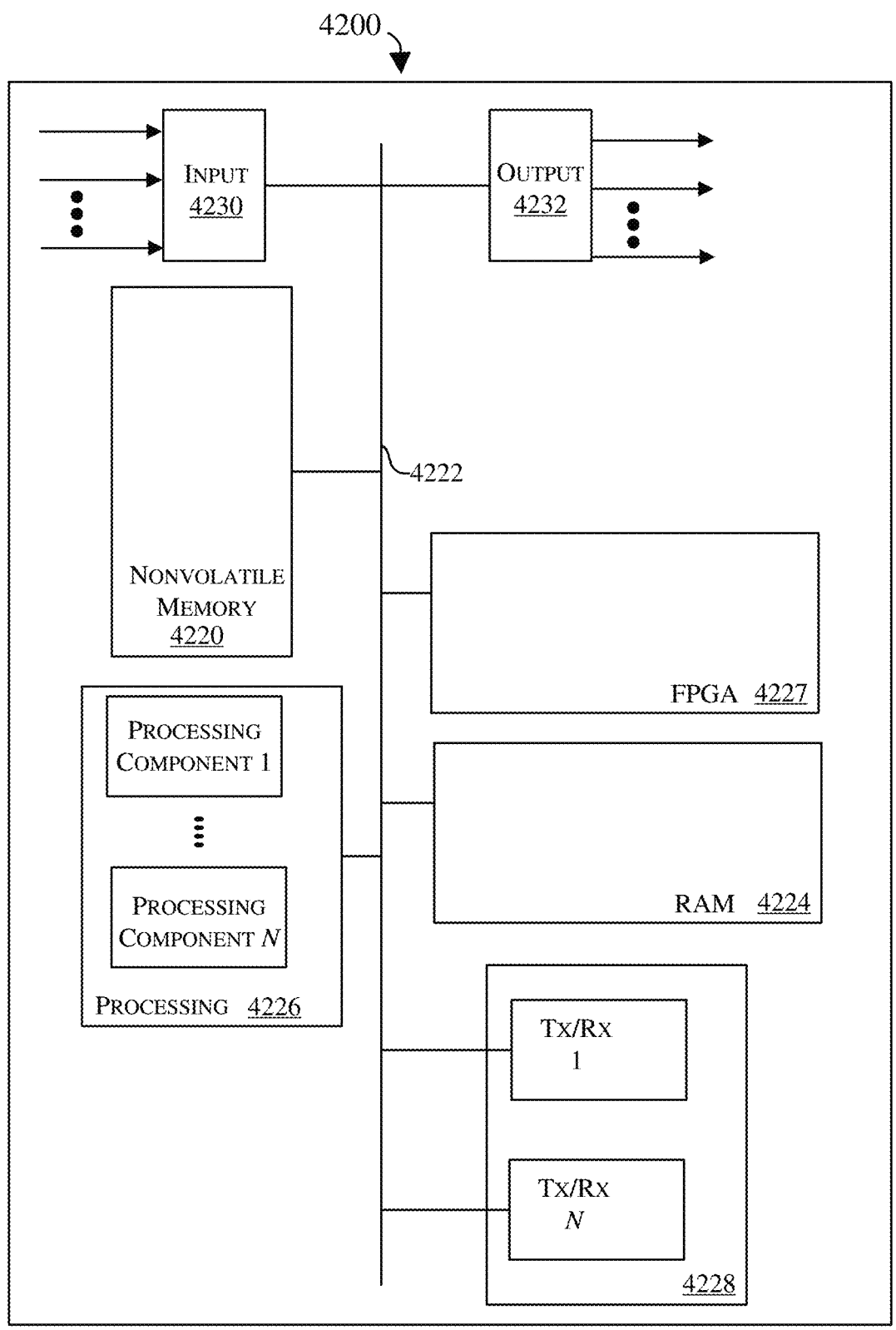
FIG. 14 is a conceptual block diagram of a computing system that may be utilized in connection with embodiments disclosed herein.

The methods described in connection with the embodiments disclosed herein may be embodied directly in hardware, in processor-executable code encoded in a non-transitory tangible processor readable storage medium, or in a combination of the two. Referring to FIG. 14 for example, shown is a block diagram 4200 depicting physical components that may be utilized, for example, as a controller in power supply 300 and/or devices incorporating power supply 300, such as electroporator 110.

As shown, bus 4222 is coupled to nonvolatile memory 4220, random access memory ("RAM") 4224, processing portion 4226 that includes N processing components, field programmable gate array (FPGA) 4227, and transceiver component 4228 that includes N transceivers. None of these components are required, and any combination of these may be included in the systems disclosed herein. For instance, where FPGA 4227 is implemented, processing portion 4226 may not be used, and vice versa. Although the components depicted in FIG. 14 represent physical components, FIG. 14 is not intended to be a detailed hardware diagram; thus, many of the components depicted in FIG. 14 may be realized by common constructs or distributed among additional physical components. Moreover, it is contemplated that other existing and yet-to-be developed physical components and architectures may be utilized to implement the functional components described with reference to FIG. 14.

In general, nonvolatile memory 4220 is non-transitory memory that functions to store (e.g., persistently store) data and processor-executable code (including executable code that is associated with effectuating the methods described herein). In some embodiments, nonvolatile memory 4220 includes bootloader code, operating system code, file system code, and non-transitory processor-executable code to facilitate the execution of a method to coordinate operation of power supply 300 as described herein.

In many implementations, nonvolatile memory 4220 is realized by flash memory (e.g., NAND or ONENAND memory), but it is contemplated that other memory types may be utilized as well. Although it may be possible to execute the code from nonvolatile memory 4220, the executable code in the nonvolatile memory is typically loaded into RAM 4224 and executed by one or more of the N processing components in processing portion 4226.

The N processing components in connection with RAM 4224 generally operate to execute the instructions stored in nonvolatile memory 4220 to enable a method for operating power supply 300 and devices incorporating power supply 300 such as electroporator 110. For example, non-transitory, processor-executable code to effectuate the methods described herein may be persistently stored in nonvolatile memory 4220 and executed by the N processing components in connection with RAM 4224. As one of ordinarily skill in the art will appreciate, processing portion 4226 may include a video processor, digital signal processor (DSP), microcontroller, graphics processing unit (GPU), or other hardware processing components or combinations of hardware and software processing components (e.g., an FPGA or an FPGA including digital logic processing portions).

In general, input component 4230 generally operates to receive one or more analog and/or digital signals (e.g., current and/or voltage signals) and output component 4232 generally operates to provide one or more analog or digital signals. For example, the output component 4232 may produce the voltage Vref (representing the charge-delivered threshold), and non-transitory, processor-executable code may be used to enable an operator of power supply 300 to configure the charge delivered threshold. It is also contemplated that a display may be incorporated with the components depicted in FIG. 4 to provide information about the charger delivered during operation. It is also contemplated that the energy delivered (e.g., in terms of Joules) may be calculated and displayed based upon the charge delivered and the associated effective voltage that is applied during a burst.

Transceiver component 4228 includes N transceiver chains, which may be used for communicating with external devices via wireless or wireline networks. Each of the N transceiver chains may represent a transceiver associated with a particular communication scheme (e.g., WiFi, Ethernet, Profibus, etc.).

Some portions are presented in terms of algorithms or symbolic representations of operations on data bits or binary digital signals stored within a computing system memory, such as a computer memory. These algorithmic descriptions or representations are examples of techniques used by those of ordinary skill in the data processing arts to convey the substance of their work to others skilled in the art. An algorithm is a self-consistent sequence of operations or similar processing leading to a desired result. In this context, operations or processing involves physical manipulation of physical quantities. Typically, although not necessarily, such quantities may take the form of electrical or magnetic signals capable of being stored, transferred, combined, compared, or otherwise manipulated. It has proven convenient at times, principally for reasons of common usage, to refer to such signals as bits, data, values, elements, symbols, characters, terms, numbers, numerals, or the like. It should be understood, however, that all of these and similar terms are to be associated with appropriate physical quantities and are merely convenient labels. Unless specifically stated otherwise, it is appreciated that throughout this specification discussions utilizing terms such as "processing," "computing," "calculating," "determining," and "identifying" or the like refer to actions or processes of a computing device, such as one or more computers or a similar electronic computing device or devices, that manipulate or transform data represented as physical electronic or magnetic quantities within memories, registers, or other information storage devices, transmission devices, or display devices of the computing platform.

As will be appreciated by one skilled in the art, aspects of the present invention may be embodied as a system, method, or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

The word "exemplary" as used means "serving as an example, instance, or illustration." Any embodiment described herein as "exemplary" should not be construed as preferred or advantageous over other embodiments.

The flowcharts and block diagrams in the drawing figures illustrate the architecture, functionality, and operation of possible implementations of systems, methods, and computer program products according to various embodiments of this disclosure. In this regard, some blocks in the flowcharts and block diagrams may represent a module, segment, or portion of code, which comprises one or more executable instructions for implementing the specified logical function (s). In some implementations, the functions noted in the block may occur out of the order set forth in the drawings. For example, two blocks shown in succession may, in fact, be executed substantially concurrently, or be executed in the reverse order, depending upon the functionality involved. It will also be understood that each block and combinations of blocks in the flowcharts and block diagrams can be implemented by special purpose hardware-based systems that perform the specified functions or acts, or combinations of special purpose hardware and computer instructions.

Although the terms first, second, third etc. may be used herein to describe various elements, components, regions, layers and/or sections, it will be understood that these elements, components, regions, layers and/or sections are not limited by these terms. These terms are only used to distinguish one element, component, region, layer or section from another region, layer, or section. Thus, a first element, component, region, layer, or section discussed below could be termed a second element, component, region, layer, or section without departing from the teachings of this disclosure.

The terminology used herein is for the purpose of describing particular embodiments only and is not intended to limit this disclosure. As used herein, the singular forms "a," "an," and "the" are intended to include the plural forms as well, unless the context clearly indicates otherwise. The terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes all combinations of one or more of the associated listed items and may be abbreviated as "/".

As used herein, the recitation of "at least one of A, B and C" or "at least one of A, B or C" is intended to mean "either A, B, C or any combination of A, B and C." This description is provided to enable any person skilled in the art to make or use the present disclosure. Various modifications to these embodiments will be readily apparent to those skilled in the art, and the generic principles defined herein may be applied to other embodiments without departing from the spirit or scope of the disclosure. Thus, the scope of this disclosure is not limited to the embodiments shown herein but is to be accorded the widest scope consistent with the principles and novel features disclosed herein.

The invention claimed is:

1. An energy delivery system comprising:
 a power supply configured to generate a pulsed output voltage and a pulsed output current; and
 an over-energy protection (OEP) circuit coupled to the power supply, the OEP circuit comprising:
 a current sensor configured to sense the output current of the power supply and to generate a sensed current signal;
 an integrator configured to integrate the sensed current signal to generate a charge-delivered signal; and a comparator configured to compare the charge delivered signal with a threshold, and to generate a fault signal to disable the power supply if the charge-delivered signal exceeds the threshold.

2. The energy delivery system of claim 1, wherein the current sensor comprises a shunt resistor and a rectifier, the shunt resistor being configured to produce a voltage drop proportional to the output current, and the rectifier being configured to produce the sensed current signal based on the voltage drop.

3. The energy delivery system of claim 1, wherein the integrator is a non-inverting integrator.

4. The energy delivery system of claim 3, wherein the non-inverting integrator comprises:
an operational amplifier having a non-inverting terminal and an inverting terminal, the non-inverting terminal being coupled to the sensed current signal, and the charge-delivered signal being produced at the output of the operational amplifier; and
an integrating capacitor and a reset resistor coupled in parallel between the output of the operational amplifier and the inverting terminal of the operational amplifier, the reset resistor providing a path for the integrating capacitor to discharge after the time interval.

5. The energy delivery system of claim 4, wherein the pulsed output voltage of the power supply comprises a constant voltage burst train, the burst train comprising a series of bursts, wherein each burst comprises a series of pulses.

6. The energy delivery system of claim 5, wherein the time interval is a duration of a burst of the burst train generated by the power supply.

7. The energy delivery system of claim 6, wherein the reset resistor is set to a value to cause the integrating capacitor to fully discharge during a time interval between bursts of the burst train.

8. The energy delivery system of claim 4, wherein the power supply comprises an energy storage capacitor bank and a pulse generator coupled by a series switch, the series switch being open when the generator is not generating the pulsed output voltage and the series switch being closed when the generator is generating the pulsed output voltage.

9. The energy delivery system of claim 8, further comprising a transistor coupled to a non-inverting input of the operational amplifier of the integrator and configured to disable the OEP circuit, based on a status of the series switch coupled to the energy storage bank of the power supply.

10. The energy delivery system of claim 1, wherein the OEP circuit is formed as an integral part of the power supply.

11. An over-energy protection (OEP) circuit for a power supply, the OEP circuit comprising:
a current sensor configured to sense an output current of the power supply and to generate a sensed current signal representative of the output current;
an integrator coupled to the current sensor and configured to integrate the sensed current signal to produce a charge-delivered signal representative of the charge delivered by the power supply over a time interval; and
a comparator coupled to the integrator and configured to compare the charge-delivered signal with a threshold and to generate a fault signal that disables the power supply when the charge-delivered signal exceeds the threshold.

12. The OEP circuit of claim 11, wherein the current sensor is a rectified output current sensor comprising a shunt resistor and a rectifier.

13. The OEP circuit of claim 11, wherein the integrator is a non-inverting integrator comprising:
an operational amplifier having a non-inverting input terminal, an inverting input terminal, and an output terminal;
an input resistor coupled between the non-inverting input terminal and the current sensor;
an integrating capacitor coupled between the output terminal and the inverting input terminal; and
a reset resistor coupled in parallel with the integrating capacitor between the output terminal and the inverting input terminal.

14. The OEP circuit of claim 13, wherein the reset resistor provides a controlled path for the integrating capacitor to discharge between output bursts of the power supply.

15. The OEP circuit of claim of claim 13, further comprising a transistor coupled to the non-inverting input of the operational amplifier of the integrator and configured to disable the OEP circuit, based on a status of a series switch coupled to an energy storage bank of the power supply.

16. A method for limiting energy delivered by a power supply, the method comprising:
sensing an output current of the power supply;
determining charge delivered by the power supply during a time interval from the sensed output current by integrating the sensed output current with an integrator circuit;
comparing the charge delivered by the power supply during the time interval with a threshold; and
disabling operating of the power supply if the total charge delivered by the power supply during the time interval exceeds the threshold.

17. The method of claim 16, wherein the time interval is a duration of a burst generated by the power supply.

18. The method of claim 16, further comprising resetting the integrator circuit by discharging an integrating capacitor of the integrator circuit between bursts generated by the power supply.

* * * * *